(12) United States Patent
Frommelt et al.

(10) Patent No.: US 10,077,936 B2
(45) Date of Patent: Sep. 18, 2018

(54) STORAGE APPARATUS, IN PARTICULAR FOR A REFRIGERATOR AND/OR FREEZER AND METHOD FOR CONTROLLING THE REFRIGERATOR AND/OR FREEZER

(71) Applicant: DIEHL AKO STIFTUNG & CO. KG, Wangen (DE)

(72) Inventors: Thomas Frommelt, Munich (DE); Joachim Lyszus, Baindt (DE); Andreas Maigler, Bad Waldsee (DE); Bruno Fuhge, Achberg (DE); Ralph Stohr, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 0 days.

(21) Appl. No.: 15/068,871

(22) Filed: Mar. 14, 2016

(65) Prior Publication Data

US 2016/0195328 A1 Jul. 7, 2016

Related U.S. Application Data

(63) Continuation of application No. PCT/EP2014/002381, filed on Sep. 3, 2014.

(30) Foreign Application Priority Data

Sep. 13, 2013 (DE) .................. 10 2013 015 230

(51) Int. Cl.
*F21V 33/00* (2006.01)
*F25D 27/00* (2006.01)

(52) U.S. Cl.
CPC ........ *F25D 27/005* (2013.01); *F25D 2500/06* (2013.01); *H03K 2217/960795* (2013.01)

(58) Field of Classification Search
CPC . F21V 33/00; F21V 21/00; F21V 7/04; F25D 27/00; F27D 21/02; F21S 4/00
(Continued)

(56) References Cited

U.S. PATENT DOCUMENTS 7,588,340 B2 9/2009 Bauer et al.
2002/0178066 A1* 11/2002 Roh .................. G06Q 20/203
705/22

(Continued)

FOREIGN PATENT DOCUMENTS

CN 1947086 A 4/2007
DE 10339904 A1 3/2005
(Continued)

*Primary Examiner* — Edwyn Labaze
(74) *Attorney, Agent, or Firm* — Laurence A. Greenberg; Werner H. Stemer; Ralph E. Locher

(57) ABSTRACT

A storage apparatus for a refrigerator and/or freezer contains a storage element for storing goods, a detection device for detecting whether the storage element is occupied by goods and an illumination device for illuminating the storage element and goods stored on the storage element and/or a storage region for the goods, which storage region is formed by the storage element. A control device is provided for actuating the illumination device depending on the result of the detection process in respect of whether the storage element is occupied by goods. The storage apparatus allows a user of the refrigerator and/or freezer to be made aware, in a simple manner, of goods possibly being stored for an excessively long time.

11 Claims, 2 Drawing Sheets

(58) Field of Classification Search
USPC .............................. 362/92, 249.02, 611–612
See application file for complete search history.

(56) References Cited

U.S. PATENT DOCUMENTS

| | | | |
|---|---|---|---|
| 2003/0056526 A1* | 3/2003 | Holmes | F25D 29/00 62/156 |
| 2006/0012985 A1* | 1/2006 | Archie, Jr. | A47B 97/00 362/227 |
| 2007/0268682 A1 | 11/2007 | Kim et al. | |
| 2007/0272677 A1 | 11/2007 | Dorwarth et al. | |
| 2008/0036746 A1 | 2/2008 | Klinghult | |
| 2008/0055084 A1 | 3/2008 | Bodin et al. | |
| 2008/0265788 A1 | 10/2008 | Yamauchi et al. | |
| 2009/0277210 A1* | 11/2009 | Eveland | F25D 11/02 62/441 |
| 2010/0085327 A1 | 4/2010 | Sleeman | |
| 2010/0320890 A1* | 12/2010 | Jung | F25D 27/00 312/402 |
| 2011/0153614 A1* | 6/2011 | Solomon | B65G 1/127 707/740 |
| 2012/0201049 A1* | 8/2012 | Sherman | G04G 19/00 362/602 |
| 2014/0045433 A1* | 2/2014 | Kim | G06Q 10/087 455/66.1 |
| 2014/0116079 A1* | 5/2014 | Murphy | F25D 17/042 62/264 |
| 2014/0268648 A1* | 9/2014 | Gomes | F25D 27/005 362/94 |
| 2014/0293060 A1* | 10/2014 | Ryu | H04N 5/2252 348/159 |
| 2014/0320040 A1* | 10/2014 | Katu | F25D 27/00 315/292 |

FOREIGN PATENT DOCUMENTS

| | | |
|---|---|---|
| DE | 102006025069 A1 | 11/2007 |
| DE | 102011075206 A1 | 11/2012 |
| WO | 2015036099 A1 | 3/2015 |

* cited by examiner

STORAGE APPARATUS, IN PARTICULAR FOR A REFRIGERATOR AND/OR FREEZER AND METHOD FOR CONTROLLING THE REFRIGERATOR AND/OR FREEZER

CROSS-REFERENCE TO RELATED APPLICATION

This is a continuation application, under 35 U.S.C. § 120, of copending international application No. PCT/EP2014/002381, filed Sep. 3, 2014, which designated the United States; this application also claims the priority, under 35 U.S.C. § 119, of German patent application No. DE 10 2013 015 230.5, filed Sep. 13, 2013; the prior applications are herewith incorporated by reference in their entirety.

BACKGROUND OF THE INVENTION

Field of the Invention

The present invention relates to a storage apparatus, to a refrigerator and/or freezer containing a storage apparatus of this kind, and to a method for controlling the operation of a refrigerator and/or freezer.

In refrigerators and/or freezers such as upright refrigerators, upright freezers, chest freezers, combination refrigerator/freezer devices and the like, it is advantageous for the user to receive information about the level of occupation of the refrigerator and/or freezer by goods. This information can help the user to for example, avoid excessively long storage of goods in the refrigerator and/or freezer.

SUMMARY OF THE INVENTION

The invention is based on the object of providing an improved measure with which the user can be provided with information about the storage of goods, for example, in a refrigerator and/or freezer.

The storage apparatus according to the invention has a storage element for storing goods, a detection device for detecting whether the storage element is occupied by goods, and an illumination device for illuminating the storage element and the goods stored on the storage element and/or a storage region for the goods, which storage region is formed by the storage element. A control device is provided for actuating the illumination device depending on the result of the detection process in respect of whether the storage element is occupied by goods.

With the storage apparatus, the user, for example, of a refrigerator and/or freezer which is equipped with the storage apparatus can be shown information about the occupation by goods and/or a change in the occupation by goods with the aid of the illumination device. Owing to the illumination of the storage element, the goods which are stored on the storage element and/or the storage region for goods, which storage region is formed by the storage element, this information can be shown to the user in a very intuitive manner. The user is made aware, in a simple manner, of goods which are potentially at risk of being stored in the refrigerator and/or freezer for too long.

With the storage apparatus of the invention, a residence time of the goods, for example, in the refrigerator and/or freezer can be monitored on the basis of the occupation of the storage element by goods which is detected by the detection device in a simple manner and a user can be informed of the residence time by the illumination device. As a result, the risk of excessively long storage (that is to say excessively long storage, for example, beyond the use-by date) of goods in the refrigerator and/or freezer can be reduced.

In this context, the term "goods" is particularly, but not exclusively, intended to denote foodstuffs, beverages, medicaments, medicinal products (blood reserves, laboratory samples etc.), chemicals and the like.

In this context, the term "storage element" is intended to denote any desired structural element which is suitable for storing goods. Goods are preferably stored—depending on the design of the storage element—on or (at least partially) in or at the storage element. In this context, suitable storage elements particularly, but not exclusively, include storage shelves (closed or grid-like, solid or with cavities, opaque or transparent etc.), door racks (on the inside of a door element etc.), holders (on the inner walls of the appliance etc.), drawers/pigeonholes and the like. In this sense, a storage element is also a floor of an appliance housing which serves or can serve as a storage surface.

In this context, the term "illumination device" is intended to comprise any kind of device which is suitable for directly and/or indirectly illuminating or lighting up a storage element, goods which are stored on the storage element and/or a storage region for goods, which storage region is formed by the storage element. To this end, the illumination device preferably has at least one lighting device which is actuated by the control device.

In this context, the term "detection device" is intended to include any kind of device which is suitable for detecting whether the storage element is occupied by goods. Occupation of the storage element by goods is preferably detected in a two-dimensional or three-dimensional manner. To this end, the detection device preferably has one or more sensors for detecting goods on/in/at the storage element, which sensors are connected (by lines or in a wireless manner) to the control device. The detection device preferably has capacitive sensors, inductive sensors, resistive sensors, piezoelectric sensors, optical sensors and/or image recording apparatuses.

In a preferred refinement of the invention, the detection device is configured to detect occupation of the storage element by goods in a spatially resolved manner, and the illumination device is configured to illuminate the storage element, the goods which are stored on the storage element and/or the storage region for goods, which storage region is formed by the storage element, in a spatially selective manner. With this refinement, the user can be informed not only about occupation of the storage element by goods overall, but the user can also be shown information about individual goods on/in/at the storage element.

In a preferred refinement of the invention, the illumination device has at least one organic light-emitting diode (as a lighting device). Organic light-emitting diodes (OLEDs) can be produced with a large surface area in a flexible manner, so that they can be matched to any desired shapes and sizes of the respective storage element in a simple manner. Organic light-emitting diodes are also cost-effective lighting devices which have a long service life and a low level of energy consumption. The organic light-emitting diode is preferably arranged such that its carrier, which can be opaque or transparent, faces, for example, the chilling compartment of the refrigerator and/or freezer. An additional cover for the organic light-emitting diode can advantageously be dispensed with in the case of this arrangement.

The organic light-emitting diode of the illumination device preferably has an electrode which simultaneously serves as a sensor electrode of the detection device. In this refinement, individual components can be used both for the illumination device and also for the detection device, so that fewer structural elements are required overall and the storage apparatus is more cost-effective overall.

In this refinement, the detection device is preferably a capacitive touch and/or proximity sensor. The detection device detects a change in the capacitive field when goods are stored on/in/at the storage element or are removed from the storage element.

Organic light-emitting diodes usually have a cathode and an anode, a light-emitting organic layer or series of layers being arranged between the cathode and anode. In this case, the anode is usually permeable to light and fitted on a light-permeable carrier. The light-permeable anode is preferably composed of indium tin oxide (ITO). The light-permeable carrier is preferably composed of glass or a plastic film (for example PET). The light-permeable anode of the organic light-emitting diode is preferably used as a sensor electrode for the detection device.

In this refinement, the detection device preferably has an evaluation circuit which is connected to the sensor electrode and which is connected (by lines or in a wireless manner) to the control device or is part of the control device. The last-mentioned variant forms a particularly compact construction.

In this refinement, the control device is preferably configured to actuate the electrode of the organic light-emitting diode, which simultaneously serves as a sensor electrode of the detection device, intermittently over time as an electrode of the organic light-emitting diode and as a sensor electrode of the detection device. The control device preferably actuates the electrode in question alternately in respect of its two functions, selectively substantially without time intervals between the different modes of operation or with time intervals between the different modes of operation. The control device preferably has a microcontroller and/or a timer for implementing this actuation.

In a preferred refinement of the invention, the storage element is configured to be arranged in an interior compartment of a refrigerator and/or freezer. In this case, the storage apparatus preferably also has a detection device for detecting at least one operating state of a chilling compartment and/or of the refrigerator and/or freezer or is connected to a detection device of this kind, and the control device is preferably configured to actuate the illumination device depending on the operating state which is detected. In this refinement, the user can be shown additional information about the respective chilling compartment or the refrigerator and/or freezer owing to the illumination of the storage element, the goods which are stored on the storage element or the storage region for goods, which storage region is formed by the storage element, and/or the illumination can be matched to the respective operating state. In this context, the term "operating state" is intended to include all kinds of states which characterize and/or influence operation of the chilling compartment or the refrigerator and/or freezer overall. In this context, the operating states include, in particular, operating states such as "Chilling function of the chilling compartment on/off", "Temperature in the chilling compartment low/medium/high", "Door element open/closed" and the like.

In this context, a "chilling compartment" is intended to denote a compartment, compartment region or compartment section in the interior compartment of a refrigerator and/or freezer which is suitable for accommodating goods. The chilling compartment is a compartment which is substantially closed or open (for example chilled shelf for displaying goods in shops). The chilling compartment can preferably be closed by a door element (for example door, flap, cover or the like) and is preferably accessible for the purpose of inserting or removing goods when the door element is open. When there are two, three or more chilling compartments, the chilling compartments are preferably separated from one another, preferably by intermediate walls, intermediate shelves or the like. In this context, chilling compartments are also intended to be understood to mean, in particular, the plurality of compartments in the interior compartment of a refrigerator and/or freezer which are separated from one another in a fixed or variable manner. When there are two, three or more chilling compartments, the chilling compartments can be closed by separate door elements or by at least partially common door elements. Depending on the chilling temperature, the chilling compartment may be a refrigeration compartment or a deep-freeze or freezing compartment. A refrigerator and/or freezer can have only refrigeration compartments, only freezing compartments or both refrigeration and freezing compartments.

In a further preferred refinement of the invention, the control device and the illumination device are configured to operate the illumination device with different lighting intensities and/or different light colors. Different operating states of the respective chilling compartment or refrigerator and/or freezer can preferably be identified to the user with the aid of different lighting intensities (including flashing lights) and/or different light colors of the kind.

In a further preferred refinement of the invention, the illumination device is fitted to the storage element or is integrated into the storage element. This arrangement allows space-saving construction of the storage apparatus of the invention. In addition, any regions or storage areas of the storage element which are occupied by goods can preferably be illuminated in this refinement of the invention.

Another subject matter of the invention is a refrigerator and/or freezer containing at least one chilling compartment which is equipped with at least one storage apparatus of the invention as described above.

A further subject matter of the invention is a method for controlling the operation of a refrigerator and/or freezer containing at least one interior compartment in which at least one storage element for storing goods is arranged. The method includes the steps of detecting whether the storage element is occupied by goods and illuminating the storage element, goods which are stored on the storage element and/or a storage region for goods, which storage region is formed by the storage element, depending on the result of the detection process in respect of whether the storage element is occupied by goods.

Occupation of the storage element by goods is preferably detected in a spatially resolved manner, and the storage element, the goods which are stored on the storage element and/or the storage region for goods, which storage region is formed by the storage element, are illuminated in a spatially selective manner.

The same advantages as achieved with the above-described storage apparatus of the invention can be achieved with said method. The advantages, definitions of terms and preferred refinements explained above in connection with the storage apparatus of the invention also apply to the method of the invention in a corresponding manner.

Other features which are considered as characteristic for the invention are set forth in the appended claims.

Although the invention is illustrated and described herein as embodied in a storage apparatus, in particular for a refrigerator and/or a freezer and a method for controlling the refrigerator and/or freezer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
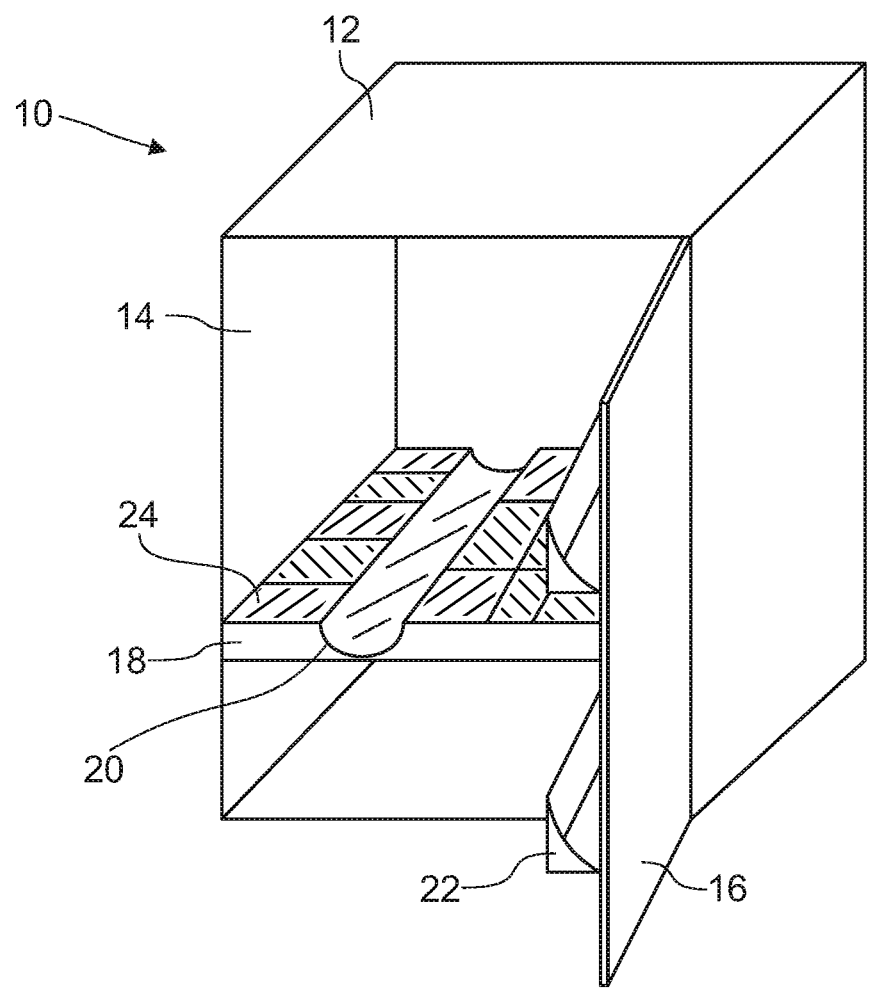
FIG. 1 is a diagrammatic, perspective view of a refrigerator and/or freezer having a storage apparatus of an exemplary embodiment according to the invention.

Referring now to the figures of the drawings in detail and first, particularly to FIG. 1 thereof, there is shown a highly simplified illustration of an open upright refrigerator 10 as an example of a refrigerator and/or freezer of the invention. The upright refrigerator 10 is suitable, in particular, for storing foodstuffs and beverages in a chilled manner. However, the upright refrigerator 10 can also be used to store medicaments, medicinal products etc.

The upright refrigerator 10 has an appliance housing 12, an interior compartment 14 of the appliance housing 12 defining one or more chilling compartments. The access opening to the interior compartment 14 can be closed by a door element 16.

A storage shelf 18 which serves as a storage element of the invention and divides the interior compartment 14 into two chilling compartments or chilling compartment regions is illustrated in the interior compartment 14 of the upright refrigerator 10. In this exemplary embodiment, the storage shelf 18 is formed with at least one recess 20 for storing bottles or the like horizontally. Two door racks 22, which serve as storage elements of the invention, are indicated on the inside of the door element 16, the inside facing the chilling compartment 14.

Figure 2:
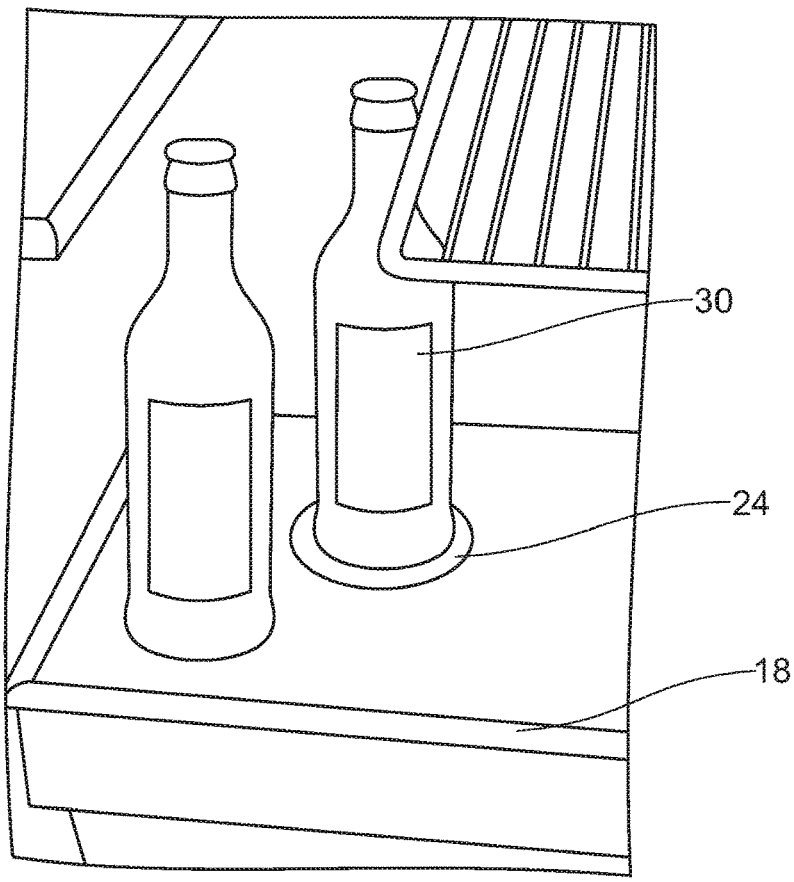
FIG. 2 is a perspective view of a detail of the refrigerator and/or the freezer having the storage apparatus according to one exemplary embodiment of the invention, which storage apparatus is occupied by goods.

As indicated in FIG. 1, the top face of the storage shelf 18, on which goods can be stored, is provided with a large number of illumination fields 24 which serve as the illumination device of the invention. Spatially selective illumination of the storage shelf 18 is possible owing to the illumination device being subdivided (in this case in a matrix-like manner) into a large number of fields. FIG. 2 shows, by way of example, how the storage shelf 18 is not illuminated beneath one bottle 30 and is illuminated beneath another bottle 30. The illumination is used to identify to the user, for example, that bottle 30 which has already been in the chilling compartment 14 for a relatively long period of time, in order to make the user aware of this and therefore possibly to prevent the bottle 30 being stored for an excessively long time beyond its use-by date.

In order to be able to identify which goods 30 have already been in the chilling compartment 14 for a relatively long period of time, a sensor system which forms part of the detection device of the invention is also associated with each of the fields. Spatially resolved detection of the occupation of the storage shelf 18 by goods is possible owing to the detection device being divided (in this case in a matrix-like manner) into a large number of fields. In this exemplary embodiment, the illumination device and the detection device are realized with a combined and therefore compact construction.

Figure 3:
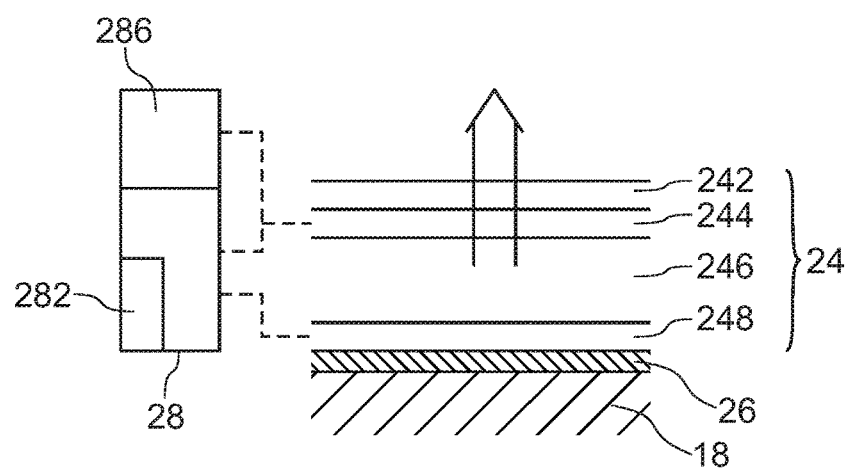
FIG. 3 is a schematic illustration of a design of the storage apparatus according to a preferred exemplary embodiment of the invention.

As shown in FIG. 3, the illumination device 24 of this exemplary embodiment has at least one organic light-emitting diode (OLED) as the lighting device in each of the fields. The organic light-emitting diode 24 is fastened (optionally in a detachable manner) to the storage shelf 18 by a connection layer 26, for example in the form of an adhesive layer.

In principle, the OLED 24 is constructed in the manner of a conventional OLED. As illustrated in FIG. 3, the OLED 24 has, for example, a light-permeable carrier 242 in the form of, for example, a plastic film (for example PET etc.), a transparent electrode 244 (for example ITO etc.) which serves as an anode, a light-emitting organic layer or series of layers 246, and an electrode 248 which serves as a cathode. The cathode 248 is arranged on the bottom face, which faces the storage shelf 18, and the transparent anode 244 and the transparent carrier 242 are arranged on the top face, which faces the chilling compartment 14. The manner of operation of an OLED 24 of this kind has long been known to a person skilled in the art, and therefore further explanations can be dispensed with at this point.

Owing to the advantageous mechanical properties of the OLED 24, the OLED can also be provided in the region of the recess 20 in the storage shelf 18 since said OLED can be matched to virtually any desired shapes and sizes.

The OLED 24 or the electrodes 244, 248 of said OLED is/are connected (by lines or in a wireless manner) to a control device 28. The control device is preferably a constituent part of the appliance control system or connected (by lines or in a wireless manner) to the appliance control system. The control device 28 contains, in particular, a microcontroller and a timer 282. The control device 28 has a dedicated electrical energy supply or is connected to the energy supply of the upright refrigerator 10. In this case, the energy supply of the control device 28 also serves to supply power to the OLED or to the OLEDs of the illumination device 24.

As illustrated in FIG. 3, the transparent anode 244 is additionally connected (by lines or in a wireless manner) to an evaluation circuit 286 which is preferably integrated into the control device 28. The electrode 244 forms not only the anode of the OLED 24 but also a sensor electrode of the detection device. The detection device is a capacitive detection device for detecting an object on the storage shelf 18 or the illumination device 24 which is fitted on the storage shelf. In this case, the detection device utilizes the effect that an object 30 on the storage shelf 18 or the illumination device 24 changes a capacitance value (of a capacitor, which by the anode 244 and the respective object with the carrier 242 as a dielectric there between) which can be detected by the evaluation circuit 286. The manner of operation of a capacitive touch and/or proximity sensor of this kind is known to a person skilled in the art in principle, and therefore further explanations can be dispensed with at this point.

Furthermore, the control device 28 is configured such that it actuates the anode 244 intermittently over time in respect of its two functions. That is to say, the two functions of the electrode 244 of the OLED 24 are actuated by the control device 28 (with the integrated evaluation circuit 286) alternately over time. In this case, small time intervals are preferably provided between the two modes of operation.

Although not illustrated, the control device 28 of the storage apparatus of the invention can additionally be connected to a detection device for detecting an operating state of the upright refrigerator 10 or the chilling compartments of the upright refrigerator in the interior compartment 14. Examples of operating states which can be detected include: "Chilling function of the chilling compartment on/off", "Temperature in the chilling compartment low/medium/high", "Chilling power for chilling compartment high/medium/low", "Door element open/closed" and the like.

In this case, the control device 28 is preferably configured such that it then also actuates the OLED 24 depending on the operating state which is detected. The various operating states of the upright refrigerator 10 can be shown to the user, for example, by different lighting intensities (including flashing light operation) and/or different light colors of the OLED 24. The illumination device or the OLEDs 24 of the illumination device are preferably activated only when a door element 16 is open since they can only be seen by the user in this situation.

Furthermore, it is possible to provide a sensor system for detecting a temperature of the storage shelf 18 and/or of the goods 30 on the storage shelf. In this variant, it is possible, for example, to signal to the user whether the stored goods 30 on the storage shelf 18 are at the correct or desired chilling temperature or not. This may be particularly advantageous, for example, in the case of beverages such as wine. The sensor system can possibly likewise be integrated into the illumination device 24 or combined with the illumination device.

The following is a summary list of reference numerals and the corresponding structure used in the above description of the invention:

10 Refrigerator and/or freezer
12 Appliance housing
14 Interior compartment
16 Door element
18 Storage shelf
20 Recess in the storage shelf
22 Door rack
24 Illumination device with OLED
242 Light-permeable carrier
244 Transparent anode
246 Light-emitting layer or series of layers
248 Cathode
26 Connection layer
28 Control device
282 Timer
286 Evaluation circuit
30 Goods

The invention claimed is:

1. A storage apparatus, comprising:
a storage element for storing goods;
a detection device for detecting whether said storage element is occupied by the goods;
an illumination device for illuminating said storage element and the goods stored on at least one of said storage element or a storage region for the goods, the storage region being formed by said storage element, said illumination device having at least one organic light-emitting diode functioning as said illumination device and functioning as at least part of said detection device; and
a control device for actuating said illumination device depending on a result of a detection process in respect of whether said storage element is occupied by any of the goods;
said control device determining a length of time each of the goods has resided in said storage element, said illumination device illuminating the goods residing longer in said storage element differently than the goods residing a shorter time in said storage element.

2. The storage apparatus according to claim 1, wherein:
said detection device is configured to detect whether said storage element is occupied by any of the goods in a spatially resolved manner; and
said illumination device is configured to illuminate said storage element and the goods stored on said storage element or the storage region for the goods, the storage region is formed by said storage element, in a spatially selective manner.

3. The storage apparatus according to claim 1, wherein said organic light-emitting diode has an electrode which simultaneously serves as a sensor electrode of said detection device.

4. The storage apparatus according to claim 3, wherein said control device is configured to actuate said electrode of said organic light-emitting diode, which simultaneously serves as said sensor electrode of said detection device, intermittently as said electrode of said organic light-emitting diode and as said sensor electrode of said detection device.

5. The storage apparatus according to claim 1, wherein:
said storage element is configured to be disposed in an interior compartment of a refrigerator or a freezer;
a further detection device for detecting at least one operating state of a chilling compartment in the interior compartment of the refrigerator or the freezer; and
said control device is configured to actuate said illumination device depending on the operating state which is detected.

6. The storage apparatus according to claim 1, wherein said control device and said illumination device are configured to operate said illumination device with at least one of different lighting intensities or different light colors.

7. The storage apparatus according to claim 1, wherein said illumination device is fitted to said storage element or is integrated into said storage element.

8. The storage apparatus according to claim 1, wherein the storage apparatus is configured for use in a refrigerator or a freezer.

9. An appliance selected from the group consisting of refrigerators and freezers, comprising:
at least one chilling compartment having at least one storage apparatus according to claim 1.

10. A method for controlling an operation of at least one of a refrigerator or a freezer having at least one interior compartment with at least one storage element for storing goods, which comprises the steps of:
detecting whether the storage element is occupied by any of the goods; and
illuminating, via an illumination device, the storage element and the goods being stored on at least one of the storage element or a storage region for the goods, the storage region is formed by the storage element, depending on a result of a detection process in respect of whether the storage element is occupied by any of the goods, the detection process being performed by a detection device where the illumination device is at least part of the detection device used for detecting the goods;

determining with a control device a length of time each of the goods has resided in the storage element;

illuminating the goods residing longer in said storage element differently than the goods residing a shorter time in said storage element with the illumination device.

11. The method according to claim 10, which further comprises:

- detecting an occupation of the storage element by the goods in a spatially resolved manner; and
- illuminating the storage element, the goods which are stored on the storage element or the storage region for the goods, which storage region is formed by the storage element, in a spatially selective manner.

* * * * *